(12) United States Patent
Hosomi et al.

(10) Patent No.: US 6,551,854 B2
(45) Date of Patent: Apr. 22, 2003

(54) SEMICONDUCTOR DEVICE HAVING BUMP ELECTRODES AND METHOD OF MANUFACTURING THE SAME

(75) Inventors: Eiichi Hosomi, Kanagawa-ken (JP); Yasuhiro Koshio, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/813,160

(22) Filed: Mar. 21, 2001

(65) Prior Publication Data

US 2001/0027007 A1 Oct. 4, 2001

(30) Foreign Application Priority Data

Mar. 28, 2000 (JP) ........................................ 2000-088452

(51) Int. Cl.[7] ........................ H01L 21/44; H01L 21/48; H01L 21/50
(52) U.S. Cl. ...................... 438/106; 438/107; 438/108; 438/51; 438/65; 438/121; 257/678; 257/685; 257/686
(58) Field of Search ........................ 438/677, 106–108, 438/25–26, 51, 64, 121; 257/628, 685–86

(56) References Cited

U.S. PATENT DOCUMENTS

| | | | |
|---|---|---|---|
| 4,855,251 A | * 8/1989 | Iyogi et al. ............ | 437/183 |
| 5,436,503 A | * 7/1995 | Kunitomo et al. ...... | 257/737 |
| 5,534,465 A | * 7/1996 | Frye et al. ............ | 437/209 |
| 5,747,881 A | 5/1998 | Hosomi et al. ......... | 257/762 |
| 5,872,051 A | * 2/1999 | Fallon et al. .......... | 438/616 |
| 5,918,113 A | * 6/1999 | Higashi et al. ......... | 438/119 |
| 5,985,692 A | * 11/1999 | Poenisch et al. ........ | 438/106 |
| 6,049,130 A | 4/2000 | Hosomi et al. ......... | 257/750 |
| 6,121,069 A | * 9/2000 | Boyko et al. .......... | 438/106 |
| 6,222,738 B1 | * 4/2001 | Maeno et al. .......... | 361/772 |
| 6,319,828 B1 | * 11/2001 | Jeong et al. ........... | 438/674 |

OTHER PUBLICATIONS

Tolvgard et al. "Reliable and environmentally friendly packaging technology–flip chip joining conductive adhesive" in Adhesive joining and coating tech in electronics manufacturing Sep.. 1998 p. 19–26.*

E. Hosomi et al., "A New Bonding M echanism of 50 μm Pitch TAB–ILB with 0.25 μm Sn Plated Cu Lead", *Proceedings of ECTC '95*, pp. 851–856, (1995).

E. Zakel et al., "Au–Sn Bonding M etallurgy of TAB Contacts and its Influence on the Kirk endall Effect in the Ternary Cu–Au–Sn System", *Proceedings of ECTC '92*, pp. 360–371, (1992).

Y. Koshio et al., "Semiconductor Dev ice, External Connection T erminal Structural Member and Method of Manufacturing Semiconductor Dev ice", U.S. patent application No. 09/665,686, f iled on Sep. 20, 2000.

* cited by examiner

*Primary Examiner*—Matthew Smith
*Assistant Examiner*—Granvill D Lee, Jr.
(74) *Attorney, Agent, or Firm*—Finnegan, Henderson, Farabow, Garrett & Dunner, L.L.P.

(57) ABSTRACT

A semiconductor device includes a bonding layer which consists of an intermetallic compound and is positioned between a first electrode and a bump electrode. The bump electrode is mainly made of Au. The intermetallic compound of the bonding layer consist of Au of the bump electrode and a low melting metal.

26 Claims, 6 Drawing Sheets

Fig. 4

| ANALYSIS POINT | Au | Sn | Cu | Ag | REMARKS |
|---|---|---|---|---|---|
| A | 54.25 | 45.29 | 0.46 | | AuSn ($\delta$ layer) |
| B | 36.65 | 63.96 | | 0.39 | AuSn$_2$ ($\epsilon$ layer) |
| C | 18.25 | 80.58 | 0.06 | 1.11 | AuSn$_4$ ($\eta$ layer) |
| D | | 96.24 | 0.6 | 3.16 | Sn-Ag$_{3.5}$ |
| E | 51.25 | 43.81 | 4.68 | 0.25 | AuSn ($\delta$ layer) + Cu |

RELATED ART

SEMICONDUCTOR DEVICE HAVING BUMP ELECTRODES AND METHOD OF MANUFACTURING THE SAME

CROSS-REFERENCE TO RELATED APPLICATION

This application claims benefit of priority under 35 USC § 119 to Japanese Patent Application No. 2000-88452, filed on Mar. 28, 2000, the entire contents of which are incorporated by reference herein.

BACKGROUND OF THE INVENTION

1. Field of the Invention

The present invention relates to a semiconductor device and a method of manufacturing the same, and more particularly to a semiconductor device in which a bump electrode is used for electric and mechanical connections between electrodes, and a method of manufacturing such a semiconductor device. Further, the invention relates to a semiconductor device in which an electrode on a substrate and a bonding pad of a semiconductor element (or a semiconductor chip) are electrically and mechanically connected via a bump electrode, and a method of manufacturing such a semiconductor device.

2. Description of the Related Art

Semiconductor devices applied to a portable terminal equipment such as a lap-top personal computer, a portable phone or the like are required to be very compact and light in weight in order to make the foregoing equipment more portable. Such semiconductor devices should have excellent electrical performance in order to assure high speed operation. In order to meet these requirements, semiconductor devices tend to employ a flip-chip structure.

The flip-chip structure features that an electrode of a substrate and a bonding pad of a semiconductor element are electrically and mechanically connected via a bump electrode. Fundamentally, the plane size of the substrate can be made as small as the plane size of the semiconductor element, which enables the semiconductor device of the flip-chip structure to be compact and light in weight. Further, no long bonding wire is used between the electrode of the substrate and the bonding pad of the semiconductor element, so that the semiconductor device can raise its operation frequency. In short, the flip-chip structure can accelerate the operation of the semiconductor device.

The semiconductor devices with the flip-chip structure are mainly classified into those which adopt a contact connection between the electrodes, and those which adopt an alloy connection between the electrodes.

In the former case, a flip-chip connection is performed using an anisotropic conductive film (ACF). The anisotropic conductive film is placed between an electrode of a substrate and a bonding pad of a semiconductor element, and mechanically connects them through thermo-compression. However, since not only a contact resistance between the anisotropic conductive film and the electrode but also a contact resistance between the anisotropic film and the bonding pad are so large that this type of connection cannot be applied to a semiconductor device which has to operate quickly.

In the latter case, an alloy layer is formed between the electrode of the substrate and the bump electrode in order to connect the electrodes. This alloy connection method can reduce the contact resistance between the electrode and the bump electrode, which enables the semiconductor device to operate at a high speed.

Referring to FIG. 8 and FIG. 9 of the accompanying drawings, a semiconductor device 100 of the flip-chip structure in the alloy connection method comprises electrodes 102 on a substrate 101, low-melting metal layers 121 on the electrodes 102, bump electrodes 123 on the metal layers 121, and bonding pads 111 for a semiconductor element 110 on the metal layers 121, and also includes alloy layers 122 between the low-melting metal layers 121 and the bump electrodes 123.

The electrode 102 is made of Cu foil, and the bonding pad 111 is made of an Al alloy film. The bump electrode 123 is made of Au, and the low melting metal layer 121 is made of an Sn—Ag alloy. The alloy layer 122 is made of an Au—Sn eutectic alloy (i.e. 80 weight percents of Au and 20 weight percents of Sn). The Sn—Ag eutectic alloy is made of Sn of the low-melting metal layer 121 and Au of the bump electrode 123.

When the alloy layer 122 is made of the Au—Sn eutectic alloy in the semiconductor device 100, Cu of the electrode 102 of the substrate 101 is diffused into the Au—Sn eutectic alloy, and a part of the alloy layer 122 changes to a ternary Au—Sn—Cu alloy. Simultaneously, Au and Sn of the Au—Sn eutectic alloy diffuse into the electrode 102. However, Cu quickly diffuses into the Au—Sn eutectic alloy compared with Au and Sn which diffuse into the electrode 102. It is therefore known that voids are caused between Cu and the Au—Sn—Cu alloy because of the Kirkendall effect. (For instance, refer to Au—Sn Bonding Metallurgy of TAB contacts and its influence on the Kirkendall effect in ternary Cu Au—Sn system. 1992 Proceedings. 42nd Electronic Components and Technology Conference (Cat. No. 92CH3056-9) (USA) xviii+1095 P.P.360-71, and so on.) It has been pointed out that the voids may deteriorate mechanical contact strength of the alloy layer 122 and disconnection due to a heat cycle.

In the foregoing semiconductor device 100, the alloy layer 122 is made of the Au—Sn eutectic alloy, so that the volume of the low-melting metal layer 121 is approximately 1.5 to 2 times larger than that of the bump electrode 123. If the low-melting metal layer 121 excessively supplies Sn, intermetallic compounds such as stable Au—Sn, Au—$Sn_2$, Au—$Sn_4$ or the like are produced, and these intermetallic compounds are very weak. In other words, they tend to reduce the mechanical contact strength of the alloy layer 122 and cause disconnection due to the heat cycle.

SUMMARY OF THE INVENTION

According to the invention, a semiconductor device comprising: a first electrode; a bump electrode formed on the first electrode and mainly made of Au; a second electrode formed on the bump electrode; and a bonding layer provided between the first electrode and the bump electrode and mainly made of an intermetallic compound which consist of Au of the bump electrode and a low-melting metal.

Further, according to the invention, a method of manufacturing a semiconductor device, comprising the steps of (1) forming a low-melting metal layer on a first electrode; (2) forming a bump electrode on a second electrode, the bump electrode being mainly made of at least Au; (3) and bringing the low-melting metal layer into contact with the bump electrode, heating these components, and forming a bonding layer mainly made of intermetallic compounds which consist of Au of the bump electrode and low melting metals.

BRIEF DESCRIPTION OF THE DRAWINGS

FIG. 4 is a componential analysis table showing results of composition analyses of crystallized regions at different parts of the bonding layer shown in FIG. 3(B).

DESCRIPTION OF THE PREFERRED EMBODIMENT

Structure of a Semiconductor Device

Figure 1:
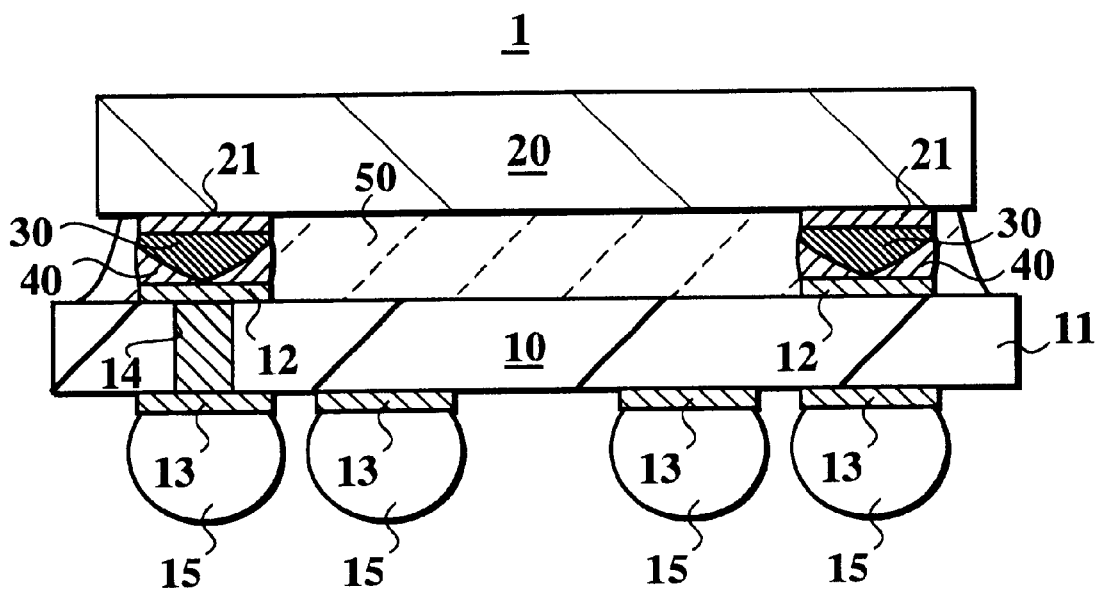
FIG. 1 is a cross section of a semiconductor device with a flip-chip structure according to an embodiment of the invention.
Figure 2:
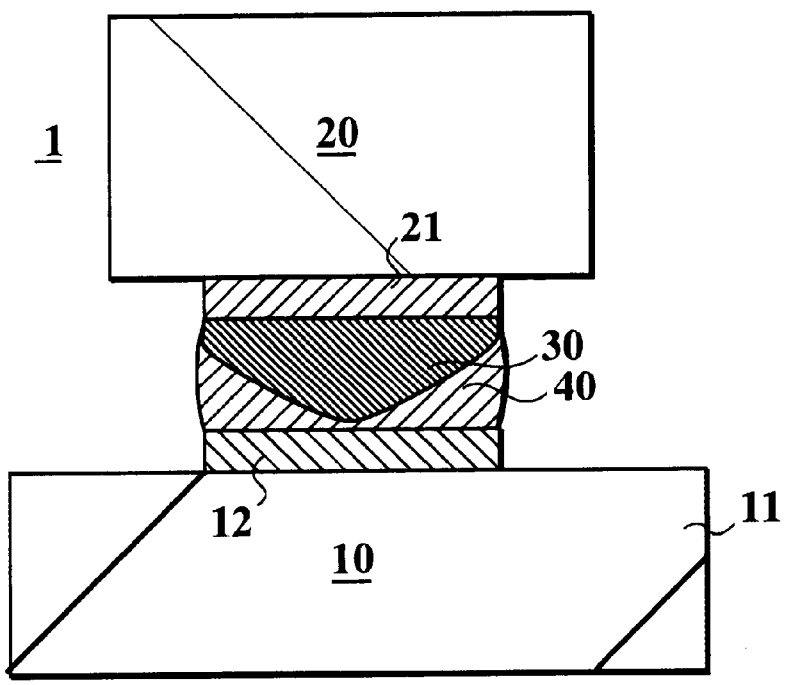
FIG. 2 is a cross section of a bonding layer between electrodes of the semiconductor device of FIG. 1.

Referring to FIG. 1 and FIG. 2, a semiconductor device 1 adopts the flip chip structure and alloy connecting method. Specifically, the semiconductor device 1 comprises first electrodes 12, bump electrodes 30 formed on the first electrodes 12 and mainly made of Au, second electrodes 21 formed on the bump electrodes 30, and bonding layers 40 formed between the first electrodes 12 and the bump electrodes 30 and mainly made of an intermetallic compound of Au in the bump electrodes 30 and low-melting metals.

The first electrodes 12 are arranged on an insulator backing 11 of a substrate 10, and are made of Cu foil having good conductivity. Alternatively, the first electrodes 12 may contain Cu at least on surfaces thereof in contact with the bump electrodes 30, or may have the surfaces made of an Au alloy.

The insulator backing 11 is preferably made of resin (or plastics) such as polyimide group resin or epoxy group resin. A circuit board (CB), resin tape or resin film and so on are usable as the substrate 10. External terminals 13 are provided on the rear surface of the insulator backing 11, and are electrically connected to the first electrodes 12 via a connection wiring 14 provided in the insulator backing 11. Solder balls 15 are electrically and mechanically connected to the external terminals 13, and are made of Pb—Sn solder, for example. Incidentally, there may are not the solder balls 15 in the external terminals 13.

A semiconductor element 20 is formed of a single crystal silicon chip, for example, and has a circuit (not shown) provided on the main surface thereof. The second electrodes 21 are arranged on the main surface of the semiconductor element 20, are so-called bonding pads, and are made of Al wirings or Al alloy wirings (e.g. Al—Cu, Al—Si, Al—Cu—Si and so on). Passivation films or the like are provided around the second electrodes 12, but will not be described in detail here.

The bump electrodes 30 are studs bump electrodes (see FIG. 1 and FIG. 2) made of Au and having projecting tops, and are directly bonded to the surfaces of the second electrodes 21 by thermo compression bonding. The bump electrodes 30 are not always required to be made of pure Au, and may be made of an Au alloy containing some additives in order to make them harder.

Further, the bump electrodes 30 may be formed by a screen printing process, etching process or coating process and so on. In such a case, the bump electrodes 30 are electrically and mechanically connected to the second electrodes 21 via barrier metal layers. Each of the barrier metal layers may be made of a Ti film, an Ni film and a Pd film which are laid over one after another on each second electrode 21. Further, in such a case, there may are not prominence in the bump electrodes 30.

Each bonding layer 40 is mainly made of an intermetallic compound which consists of Au of the bump electrode 30 and a low-melting metal. The low-melting metal is at least Sn or an alloy of Sn—Ag, Sn—In, Sn—Bi, Sn—Cu or Sn—Pb, i.e. a low-melting metal containing Sn as a main component. The low-melting metal is not always limited to be unitary and binary but may be ternary (e.g. Sn—Ag—Cu, Sn—Bi—Cu and so on) or hyper complex. In this embodiment, Sn—Ag is used as the low-melting metal.

Fifty weight percents or more of the bonding layer 40 are made of one of or a plurality of intermetallic compounds of $Au_1$—$Sn_1$, $Au_1$—$Sn_2$ and $Au_1$—$Sn_4$, and a small part thereof is made of an Sn—Ag low-melting metal, so that the bonding layer 40 is substantially free from an Au—Sn eutectic alloy.

Figure 3A:
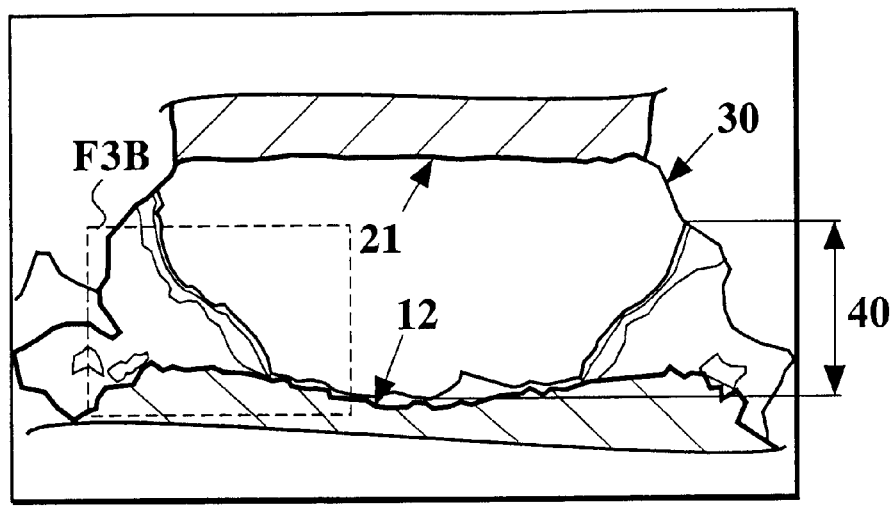
FIG. 3(A) is a cross section of crystallized regions of the bonding layer, being prepared on the basis of a cross sectional photograph of the bonding layer.
Figure 3B:
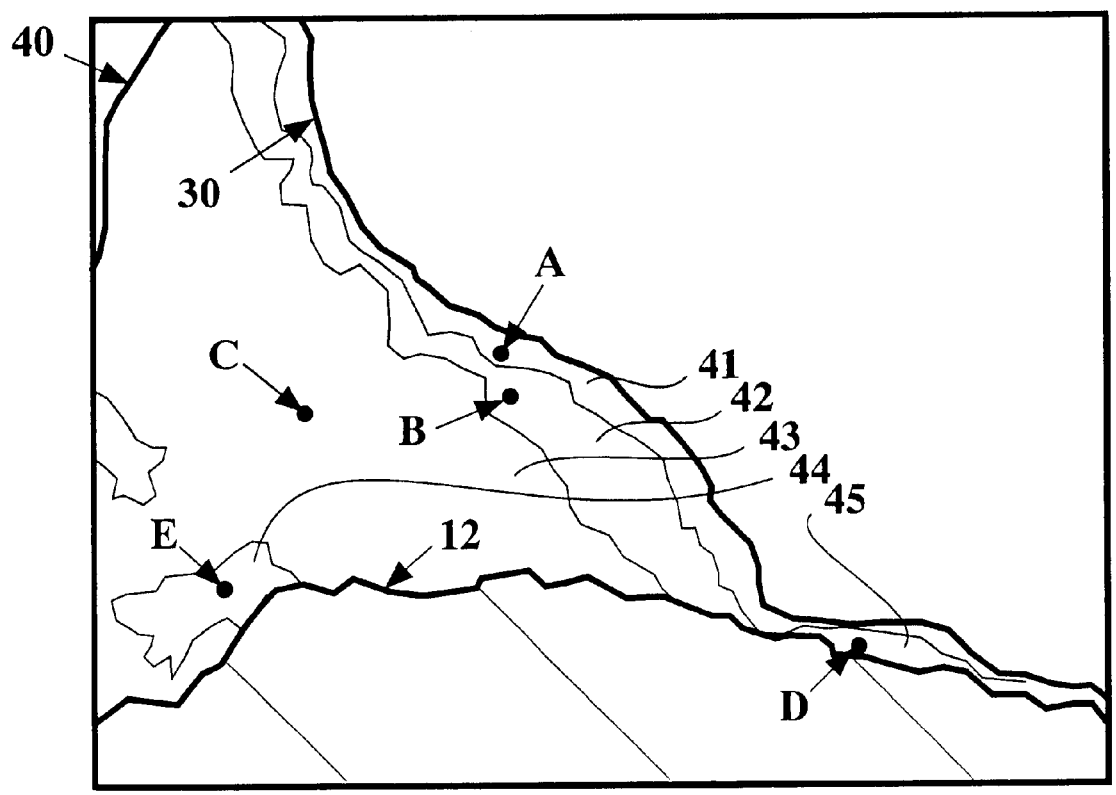
FIG. 3(B) is an enlarged view of the part F3B in FIG. 3(A).

In the semiconductor device 1 (shown in FIG. 3(A)) actually made by the inventor, the bump electrode 30 is forced into the center of the bonding layer 40 so as to be near the first electrode 12, i.e. the bonding layer 40 swells at its peripheral area and becomes thick. Crystallized regions 41 to 45 shown in FIG. 3(B) are present at the thick part of the bonding layer 40. Refer to FIG. 4 showing the analysis results of these regions.

Referring to FIG. 3(B), the crystallized region 41 (i.e. an analysis point A) which is the nearest the bump electrode 30 is an $Au_1$- $Sn_1$ intermetallic compound. The crystallized region 42 (i.e. an analysis point B) which is nearer the bump electrode 30 is an $Au_1$—$Sn_2$ intermetallic compound. The crystallized region 43 (i.e. an analysis point C) which is near the bump electrode 30 is an $Au_1$—$Sn_4$ intermetallic compound. It is considered that a large amount of Au of the bump electrode 30 is diffused into the crystallized region 41. The crystallized regions 42 and 43 gradually go away from the bump electrode 30, and becomes equivalent to low-melting metals since a large amount of Sn is diffused thereto. The foregoing intermetallic compounds are made not to become chemically (and metallurgically) stable by making the volume of the bonding layer 40 smaller than that of the bump electrode and by reducing the amount of Sn to be diffused into the bonding layer 40.

A crystallized region 44 (i.e. an analysis point D) made of an Sn—Ag low-melting metal is present outside the crystallized region 43. Further, a crystallized region 45 (i.e. an analysis point E) made of an Au—Sn—Cu low melting metal is present at the bonding layer 40 between the center of the bump electrode 30 and the center of the first electrode 12. Positioned near the first electrode 12, the crystallized region 45 is considered to contain some diffused Cu.

Referring to FIG. 1 and FIG. 2, a protective resin layer 50 is provided between the surface of the substrate backing 10 and the main surface of the semiconductor element 20, thereby protecting the semiconductor element 20 against invading water and contaminant. Further, the protective resin layer 50 extends over the bonding layer 40 in order to protect it against external stress, thereby prolonging the life of the bonding layer 40 against the heat cycle.

In the foregoing semiconductor device 1, the bonding layer 40 between the first electrode 12 and the bump electrode 30 is mainly made of the intermetallic compound, or 50 weight percents or more of the bonding layer 40 are made of the intermetallic compound, so that no Au—Sn eutectic alloy will be produced therein. This prevents voids from being formed in the first electrode 12 near the bonding layer 40, and improves the reliability of the bonding layer 40 against the heat cycle.

Further, since the volume of the bonding layer 40 is smaller than that of the bump electrode 30, it is possible to control the growth of an intermetallic compound consisting of Au of the bump electrode 30 and Sn of the bonding layer 40, and to prevent the production of stable and weak intermetallic compounds. This also improves the reliability of the bonding layer 40 against the heat cycle.

Method of Manufacturing the Semiconductor Device

The semiconductor device 1 is manufactured as follows according to the procedures shown in FIG. 5 to FIG. 7.

Figure 5:
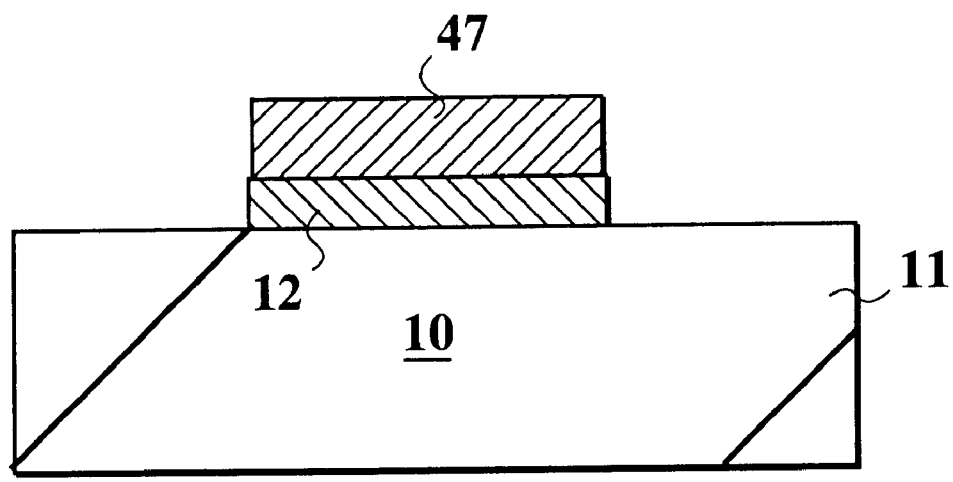
FIG. 5 is a cross section showing a process for manufacturing a semiconductor device.

(1) First of all, the substrate 10 is prepared, and a low-melting metal layer 47 is formed on the first electrode 12 of the substrate backing 10 as shown in FIG. 5. In this embodiment, the low-melting metal layer 47 is made of an Sn—Ag alloy, and is formed on the first electrode 12 by the screen printing process. The low-melting metal layer 47 has its thickness adjusted in order that the volume of the bonding layer 40 (to be formed later) is smaller than that of the bump electrode 30 and an amount of Sn to be supplied to the bonding layer 40 from the low-melting metal layer 47 is appropriately reduced.

Figure 6:
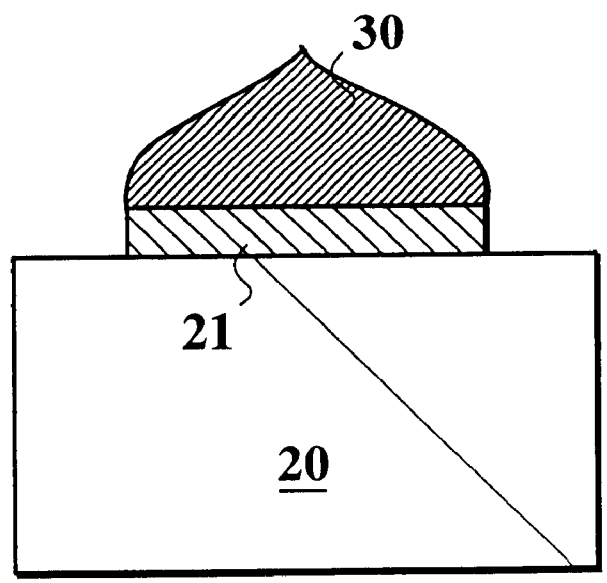
FIG. 6 is a continuation of the process in FIG. 5.
Figure 7:
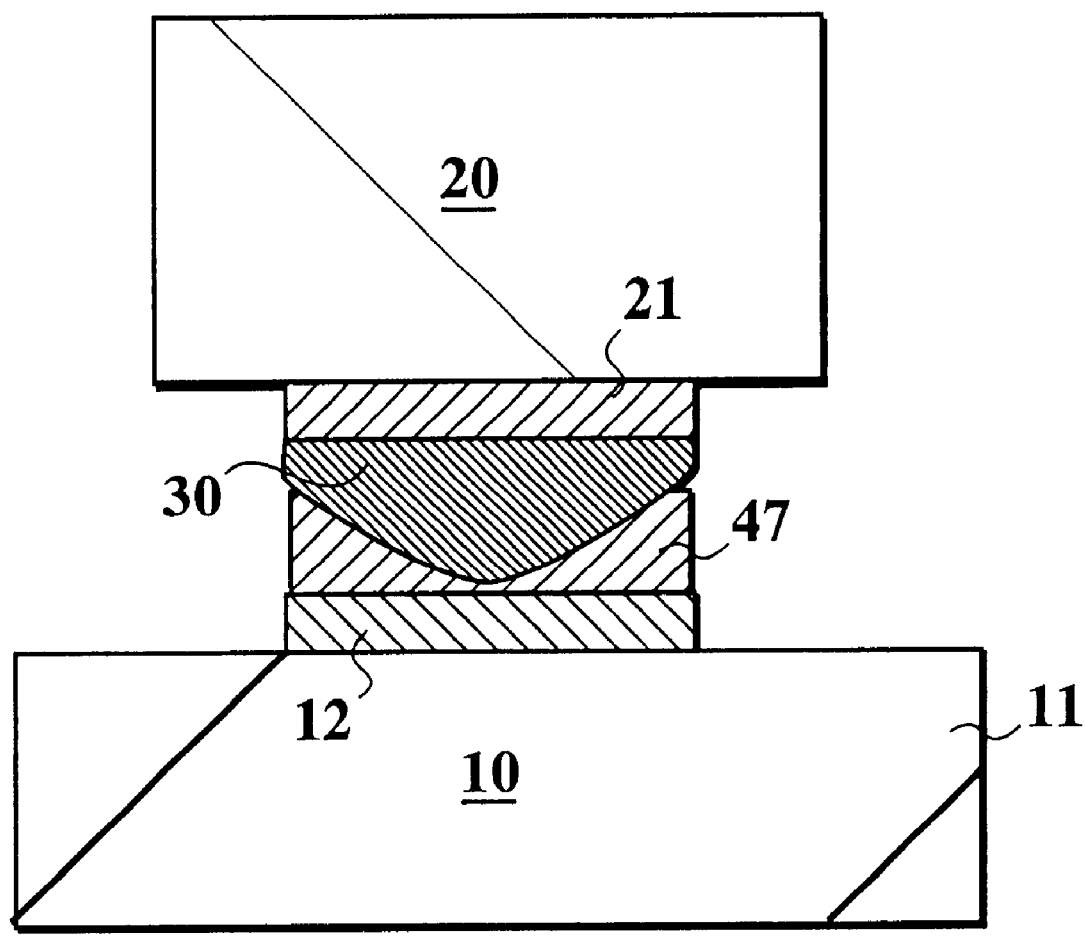
FIG. 7 is a continuation of the process in FIG. 6.
Figure 8:
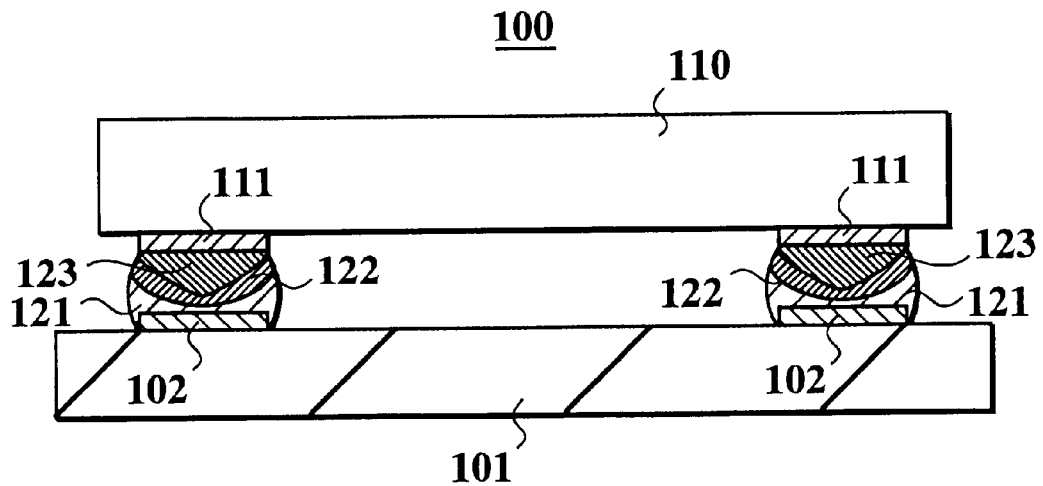
FIG. 8 is a cross section of a semiconductor device of the related art.
Figure 9:
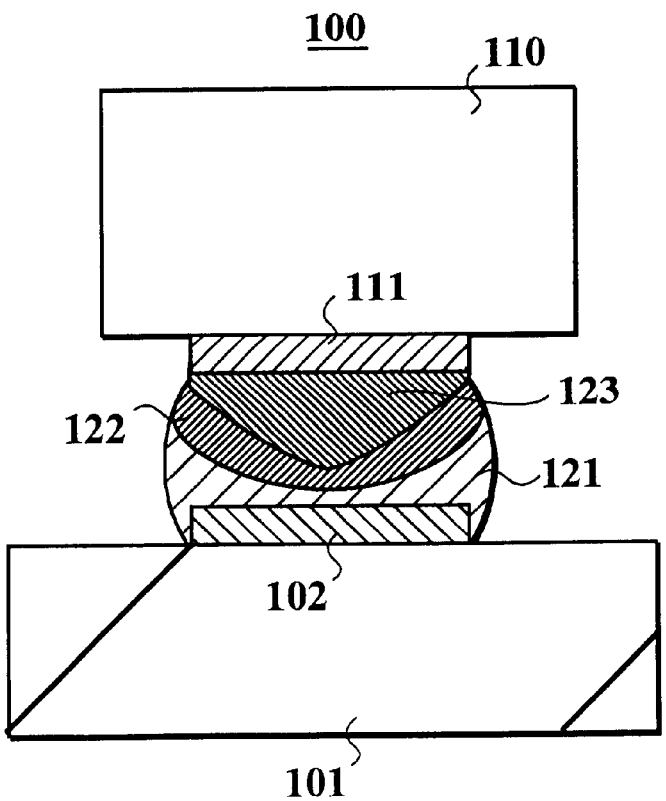
FIG. 9 is an enlarged cross section of a bonding layer between electrodes of the semiconductor device in FIG. 8.

(2) Concurrently, the semiconductor element 20 is prepared, and the bump electrode 30 is formed on the second electrode (i.e. the bonding pad) 21 of the semiconductor element 20, as shown in FIG. 6. The bump electrode 30 is of a stud type, consists of Au, and is formed by the wire bonding process. Alternatively, the bump electrode 30 may be formed prior to the formation of the low-melting metal layer 47 on the first electrode 12.

(3) The first electrode 12 and the second electrode 21 are aligned with each other. Then, the bump electrode 30 is brought into contact with the low melting metal layer 47, and is deformed together with the low-melting metal layer 47 with appropriate load applied thereto as shown in FIG. 7.

(4) The low-melting metal layer 47 and bump electrode 30 are heated at a temperature of 200° C. to 300° C. (for example) in order to form the bonding layer 40 between the first electrode 12 and the bump electrode 30. The bonding layer 40 is made of an intermetallic compound consisting of Sn of the low-melting metal layer 47 and Au of the bump electrode 30. The bonding layer 40 has 50 weight percents or more thereof made of at least one of or a plurality of the following intermetallic compounds of Au and Sn: $Au_1Sn_1$, $Au_1$—$Sn_2$, and $Au_1$—$Sn_4$. Further, the bonding layer 40 is substantially free from the Au—Sn eutectic alloy. Therefore, the first electrodes 12 and second electrodes 21 are electrically and mechanically connected via the bonding layer 40 and the bump electrode 30, so that the semiconductor element 20 is mounted on the substrate backing 10 at the same time.

(5) The protective resin layer 50 is formed between the substrate backing 10 and the semiconductor element 20 in order to cover the main surface of the semiconductor element 20, the bonding layer 40 and so on between the first electrodes 12 and second electrodes 21. The protective resin layer 50 is preferably made of epoxy group resin made by potting process, for example.

(6) The semiconductor device 1 is completed after the foregoing procedures.

The foregoing method is effective in improving the reliability of the bonding layer 40 between the first electrodes 12 and second electrodes 21, and improving the yield of the semiconductor device 1.

Other Embodiments of the Invention

The invention being thus described, it will be obvious that the same way may be varied in many ways. Such variations are not to be regarded as a departure from the spirit and scope of the invention, and all such modifications as would be obvious to one skilled in the art are intended to be included within the scope of the invention.

The present invention is applicable to connections between electrodes of substrates which are stacked vertically, as well as to the foregoing embodiment in which the invention is applied to the semiconductor device 1 where the first electrode 12 of the substrate backing 10 and the second electrode 12 of the semiconductor element 20 are connected via the bonding layer.

In the foregoing embodiment, the bump electrodes 30 of the semiconductor device 1 are of the stud type. Alternatively, they may be ordinary bump electrodes.

It is needless to say that the invention covers a number of many embodiments which are not described. The technical scope of the invention is defined only by the spirit of the accompanying claims.

As described so far, the invention is effective in reducing voids in the bonding layer between the electrodes, and in improving the mechanical strength of the bonding layer and the reliability of the semiconductor device against the heat cycle.

Further, the invention offers the method for manufacturing the semiconductor device which is effective as described above.

What is claimed is:

1. A semiconductor device comprising:
   a substrate;
   a first electrode on the substrate;
   bump electrode formed on the first electrode and mainly made of Au;
   a second electrode formed on the bump electrode; and
   a bonding layer provided between the first electrode and the bump electrode and mainly made of an intermetallic compound which consists of Au of the bump electrode and a low melting metal.

2. The semiconductor device of claim 1, the first electrode has a surface layer made of at least Cu or a Cu alloy.

3. The semiconductor device of claim 2, wherein the first electrode is provided on a circuit board.

4. The semiconductor device of claim 1, wherein the second electrode is mainly made of an Al alloy.

5. The semiconductor device of claim 4, wherein the second electrode has a barrier metal layer formed on an uppermost layer thereof.

6. The semiconductor device of claim 4, wherein the second electrode is a bonding pad for a semiconductor element.

7. The semiconductor device of claim 1, wherein the bump electrode is a stud bump electrode.

8. The semiconductor device of claim 1, wherein the bonding layer has 50 weight percents or more made of at least one of or a plurality of the following the intermetallic compound of Au and Sn;
   (1) $Au_1$—$Sn_1$,
   (2) $Au_1$—$Sn_2$, and
   (3) $Au_1$—$Sn_4$.

9. The semiconductor device of claim 1, wherein the low-melting metal of the bonding layer is made of at least Sn or an Sn alloy of at least one of Ag, In, Bi, Cu or Pb.

10. The semiconductor device of claim 8, wherein a volume of the bonding layer is smaller than a volume of the bump electrode.

11. The semiconductor device of claim 9, wherein a volume of the bonding layer is smaller than a volume of the bump electrode.

12. A semiconductor device comprising:
   a substrate including a first electrode;
   a bump electrode formed on the first electrode and mainly made of Au;
   a semiconductor element having a second electrode formed on the bump electrode; and
   a bonding layer provided between the first electrode and the bump electrode and mainly made of an intermetallic compound which consist of Au of the bump electrode and a low-melting metal.

13. The semiconductor device of claim 12, wherein the first electrode has a surface layer made of at least Cu or a Cu alloy.

14. The semiconductor device of claim 13, wherein the low-melting metal of the bonding layer are made of at least Sn or an Sn alloy of at least one of Ag, In, Bi, Cu or Pb.

15. The semiconductor device of claim 14, wherein the bonding layer has 50 weight percents or more made of at least one of or a plurality of the following the intermetallic compound of Au and Sn;
   (1) $Au_1$—$Sn_1$,
   (2) $Au_1$—$Sn_2$, and
   (3) $Au_1$—$Sn_4$.

16. The semiconductor device of claim 15, wherein the bonding layer includes the intermetallic compound of $Au_1$—$Sn_1$, $Au_1$—$Sn_2$ and $Au_1$—$Sn_4$ which are laid over one after another from a side of the bump electrode toward the first electrode.

17. A method of manufacturing a semiconductor device, comprising the steps of:
   (1) forming a low-melting metal layer on a first electrode;
   (2) forming a bump electrode on a second electrode, the bump electrode being mainly made of at least Au; and
   (3) bringing the low-melting metal layer into contact with the bump electrode, heating these components, and forming a bonding layer mainly made of an intermetalliclic compound which consist of Au of the bump electrode and the low melting metal.

18. The method of claim 17, wherein in the step (3), the first and second electrodes are electrically and mechanically connected via the bonding layer and the bump electrode.

19. The method of claim 17, wherein a stud bump electrode is formed in the step (2).

20. The method of claim 17, wherein the low-melting metal and the bump electrode are heated at a temperature range between 200° C. and 300° C. in the step (3).

21. A semiconductor device comprising:
   a substrate;
   a first electrode on the substrate;
   a bump electrode formed on the first electrode and mainly made of Au;
   a second electrode formed on the bump electrode; and
   a bonding layer provided between the first electrode and the bump electrode and mainly made of an intermetallic compound which consists of Au of the bump electrode and a low melting metal, the intermetallic compound being more abundant than a eutectic alloy which consists of Au and the low-melting metal.

22. The semiconductor device of claim 21, wherein the intermetallic compound is 50 weight percent or more.

23. A semiconductor device comprising:
   a substrate including a first electrode;
   a bump electrode formed on the first electrode and mainly made of Au;
   a semiconductor element having a second electrode formed on the bump electrode; and
   bonding layer provided between the first electrode and the bump electrode and mainly made of an intermetallic compound which consists of Au of the bump electrode and a low-melting metal, the intermetallic compound being more abundant than a eutectic alloy which consists of Au and the low-melting metal.

24. The semiconductor device of claim 23, wherein the intermetallic compound is 50 weight percent or more.

25. A method of manufacturing a semiconductor device, comprising:
   forming a low-melting metal layer on a first electrode;
   forming a bump electrode on a second electrode, the bump electrode being mainly made of at least Au; and
   bringing the low-melting metal layer into contact with the bump electrode, heating these components, and forming a bonding layer mainly made of an intermetalliclic compound which consists of Au of the bump electrode and the low-melting metal, the intermetallic compound being more abundant than a eutectic alloy which consists of Au and the low-melting metal.

26. The method of claim 25, wherein the intermetallic compound is 50 weight percent or more.

* * * * *

UNITED STATES PATENT AND TRADEMARK OFFICE
CERTIFICATE OF CORRECTION

PATENT NO. : 6,551,854 B2
DATED : April 22, 2003
INVENTOR(S) : Hosomi et al.

It is certified that error appears in the above-identified patent and that said Letters Patent is hereby corrected as shown below:

<u>Title page,</u>
Item [57], ABSTRACT,
Line 5, change "consist" to -- consists --.
Line 6, change "low melting" to -- low-melting --.

<u>Column 6,</u>
Line 47, change "bump" to -- a bump --.
Line 53, change "low melting" to -- low-melting --.

<u>Column 7,</u>
Lines 2 and 35, change "percents" to -- percent --.
Lines26 and 56, change "consist" to -- consists --.
Line 32, change "are" to -- is --.
Line 44, change "$Au_1$-$Sn_2$and $Au_1$-$Sn_4$which" to -- $Au_1$-$Sn_2$ and $Au_1$-$Sn_4$ which --.
Lines 55-56, change "intermetalliclic" to -- intermetallic --.
Line 57, change "low melting" to -- low-melting --.

<u>Column 8,</u>
Line 20, change "low melting" to -- low-melting --.
Line 32, change "bonding" to -- a bonding --.
Line 48, change "intermetalliclic" to -- intermetallic --.

Signed and Sealed this

Eighth Day of July, 2003

JAMES E. ROGAN
*Director of the United States Patent and Trademark Office*